Dec. 6, 1966

L. J. YUSKA 3,290,637

MICROELECTRONIC MODULE ASSEMBLY

Filed Dec. 9, 1963

INVENTOR.
LEONARD J. YUSKA,
BY
H. H. Losche
Paul S. Collignon ATT'YS.

United States Patent Office 3,290,637
Patented Dec. 6, 1966

3,290,637

MICROELECTRONIC MODULE ASSEMBLY

Leonard J. Yuska, Greenwood, Ind., assignor to the United States of America as represented by the Secretary of the Navy Filed Dec. 9, 1963, Ser. No. 329,324
1 Claim. (Cl. 339—17)

The invention described herein may be manufactured and used by or for the Government of the United States of America for governmental purposes without the payment of any royalties thereon or therefor.

The present invention relates to a microelectronic module assembly and more particularly to a module assembly having attached connector terminals in order to provide a plug-in unit.

There is a constant demand for smaller electrical and electronic components, particularly in the aircraft and missile fields, as weight is of extreme importance. One concept of microelectronics which has been recently developed and which offers a great reduction in size and weight of electronic units is that of integrated circuitry which is formed on insulated bases such as glass, fused silica, or ceramic substrates. Integrated circuitry includes a number of active and passive components which are fabricated by one or more of a combination of several thin-film deposition techniques onto a glass or ceramic substrate.

Present day techniques dictate that an integrated circuitry assembly be designed as a plug-in unit, and hence a socket unit for making electrical connections to the board is required. However, the small size of the assembled unit and the very thin layer of deposited films make it difficult to design an adequate connector. Heretofore, most connectors provide a sliding contact arrangement between plugs and sockets, but these cause scraping and abrading of the thin films, which soon become damaged.

One recently developed connector for printed circuit boards is shown in U.S. Patent 3,048,811, issued Aug. 7, 1962, to Tom Lock. In this patent, a plurality of bifurcated socket contacts are provided that are made of a single length of smooth spring wire. The wire is bent to provide two resilient inwardly bowed contact portions that engage the printed circuit board. While this arrangement does permit a plurality of contacts to be mounted in a very small space, neveretheless, there is sliding contact between the wires and the connector pads on the printed circuit board.

In order to eliminate the wear of the very thin layers of deposited films, male terminals have been fastened to conductor pads, and the terminals are subjected to the wear occasioned by the plugging in and removing from the mating socket. However, upon plugging in or removal from the sockets, the conductor pads of deposited film were subjected to a shearing force which often causes the pads to be peeled from their substrates.

In the present invention, a plurality of male terminals are provided on an integrated circuitry assembly with each terminal having a pair of U-shaped end portions that hook or wrap around the integrated circuitry assembly. Upon plugging in or upon removal from a mating socket, any shearing force encountered is transferred to the substrate rather than to the pads of thin film conductors.

It is therefore a general object of the present invention to provide an improved plug-in assembly using integrated circuitry components.

Another object of the present invention is to provide an improved terminal for use with integrated circuitry components.

Other objects and advantages of the present invention will be readily appreciated as the same becomes better understood by reference to the following detailed description when considered in connection with the accompanying drawing wherein.

Figure 1:
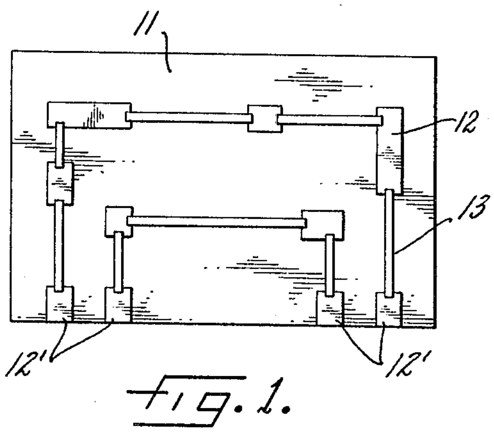
FIGURE 1 is a top plan view of an integrated circuitry component.

Referring to FIGURE 1 of the drawing, there is shown a substrate 11 having a plurality of conductors 12 and a plurality of resistors 13 deposited on the front surface thereof. Four conductors are shown adjacent the bottom edge of substrate 11, and as these four conductors are used as contact points, these conductors are designated as conductor pads 12'. The choice of conductor material is governed by a number of factors including adhesion to substrate and to adjacent layers, and compatibility with materials of adjacent layers. Metals such as chromium, titanium, and aluminum adhere tenaciously to other metals, glass and ceramics, but are extremely difficult to solder because they form an oxide coating. On the other hand, metals such as copper, gold, and silver are easily soldered, but do not adhere well to glass or ceramic. Consequently, it is often desirable to use two or more metals to obtain a satisfactory conductor, such for example, as by first depositing a layer of chromium, and then depositing a layer of gold on the chromium before the chromium has had time to form an oxide coating thereon.

A suitable thin-film resistor material should be chemically inert to atmospheric gases, electrically and thermally stable, and relatively free of electrical and thermal noise. In addition, the film should be capable of adhering tenaciously to the substrate and have a coefficient of thermal expansion approximating that of the substrate material. One widely used thin-film material in tin oxide which is deposited on a substrate by the hydrolysis of tin chloride. Other widely used materials are tantalum and nickel-chromium. By way of example, conductors 12 are first deposited on substrate 11, and then resistors 13 are deposited on substrate 11 and overlap conductors 12, as shown in the drawing.

Figure 2:
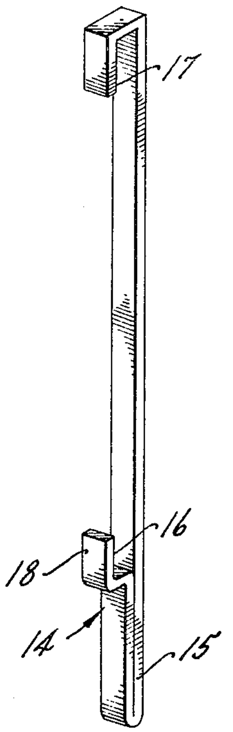
FIGURE 2 is a perspective view of a male terminal for use with an integrated circuitry component.

Referring now to FIGURE 2 of the drawing, there is shown a male terminal 14 of sheet metal that has a contact portion 15 that is formed by bending or folding the metal back against itself. A U-shaped bend is provided on each end of terminal 14. These bends are designated 16 and 17.

Figure 3:
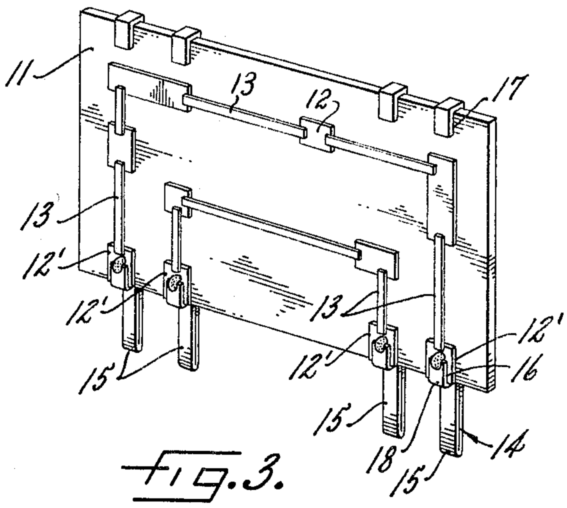
FIGURE 3 is a perspective view of a complete integrated circuitry assembly.

As shown in FIGURE 3 of the drawing, a plurality of terminals 14 are provided on substrate 11 with the bottom end portions 18 of each terminal being in contact with a separate conductor pad 12'. The U-shaped bend 16 hooks around the bottom portion of substrate 11, and U-shaped bend 17 hooks around the top portion of substrate 11. In order to make a good electrical contact between the conductor pads 12' and the bottom end portions 18 it may be desirable to solder these elements together.

Upon plugging in the contact portions 15 in a mating connector, U-shaped bend 16 will prevent any relative movement between the terminals 14 and substrate 11 and thus no shearing force will be applied to the thin-film conductor pads 12'. Likewise when the contact portions 15 are removed from a mating connector, the U-shaped bend 17 will prevent any relative movement between terminals 14 and substrate 11.

It can thus be seen that the present invention provides an integrated circuitry assembly that can be used as a plug-in unit, and is relatively simple and economical to make. Obviously many modifications and variations of the present invention are possible in the light of the above teachings. It is therefore to be understood, that within the scope of the appended claim, the invention may be practiced otherwise than as specifically described.

What is claimed is:

A microelectronic module assembly comprising:

a nonconducting substrate having a front surface and substantially parallel top and bottom surfaces, said front surface having deposited thereon a plurality of thin-film components at least two of which are conductor pads, and a plurality of terminals, one each for each said conductor pad, each said terminal extending along and being adjacent the entire height of said back side and having a contact portion comprised of a double layer of folded metal and extending beyond said bottom surface and first and second inwardly opposed U-shaped bends, said first U-shaped bend being in contact with said bottom surface and having the end portion thereof in contact with one of said conductor pads and said second U-shaped bend being in contact with said top surface and having the end portion thereof in contact with said front surface of said substrate.

References Cited by the Examiner

UNITED STATES PATENTS

| | | | |
|---|---|---|---|
| 2,899,608 | 8/1959 | Wellard | 317—101 |
| 2,946,976 | 7/1960 | Blain | 339—17 |
| 3,138,675 | 6/1964 | Krone | 339—17 X |
| 3,155,767 | 11/1964 | Schellack | 174—68.5 |
| 3,158,418 | 11/1964 | Rush | 339—17 |

FOREIGN PATENTS

| | | |
|---|---|---|
| 233,970 | 5/1961 | Australia. |
| 1,081,098 | 5/1960 | Germany. |

EDWARD C. ALLEN, *Primary Examiner.*

ALFRED S. TRASK, *Examiner.*